US012638497B2

(12) United States Patent
Lou et al.

(10) Patent No.: US 12,638,497 B2
(45) Date of Patent: May 26, 2026

(54) METHOD OF HAVING GOOD THERMAL ISOLATION IN WAFER TEST CASSETTE

(71) Applicant: XINGR TECHNOLOGIES (ZHEJIANG) LIMITED, Yiwu City (CN)

(72) Inventors: Choon Leong Lou, Singapore (SG); Ho Yeh Chen, Zhubei City (TW)

(73) Assignee: XINGR TECHNOLOGIES (ZHEJIANG) LIMITED, Yiwu City (CN)

( * ) Notice: Subject to any disclaimer, the term of this patent is extended or adjusted under 35 U.S.C. 154(b) by 103 days.

(21) Appl. No.: 18/622,178

(22) Filed: Mar. 29, 2024

(65) Prior Publication Data

US 2025/0093407 A1     Mar. 20, 2025

(30) Foreign Application Priority Data

Sep. 15, 2023   (CN) .......................... 202311197186.X
Dec. 29, 2023   (CN) .......................... 202311864258.1

(51) Int. Cl.
  *G01R 31/28*       (2006.01)
  *G01R 1/04*        (2006.01)
      (Continued)

(52) U.S. Cl.
  CPC ....... *G01R 31/2875* (2013.01); *G01R 1/0416* (2013.01); *G01R 1/07342* (2013.01);
      (Continued)

(58) Field of Classification Search
  CPC ............ G01R 1/07314; G01R 31/2831; G01R 31/2891
  See application file for complete search history.

(56) References Cited

U.S. PATENT DOCUMENTS 5,198,752 A  *  3/1993  Miyata ............... G01R 31/2875
                                              324/750.08
6,265,888 B1    7/2001  Hsu
                  (Continued)

FOREIGN PATENT DOCUMENTS

CN        112782438 A     5/2021
JP          4314343 A    11/1992
                  (Continued)

OTHER PUBLICATIONS

Japan Patent Office, Notice of Allowance issued on Mar. 3, 2026 for JP application No. 2024-157627.

*Primary Examiner* — Huy Q Phan
*Assistant Examiner* — Temilade S Rhodes-Vivour
(74) *Attorney, Agent, or Firm* — Li & Cai Intellectual Property (USA) Office

(57)          ABSTRACT

A wafer test cassette having a fluid inlet and a fluid outlet, includes a first housing, a second housing, a heat source, and an isolation device. The first housing includes a probe card including probes. The second housing is coupled to the first housing, so that a test space is defined. The second housing carries a wafer arranged in the test space, and the probes are electrical contact with an upper surface of the wafer. The heat source heats a lower surface of the wafer, and a high temperature region is defined between the lower surface and the second housing. The solation device surrounds the high temperature region for thermally isolating the high temperature region from the test space. The fluid inlet receives a gas, the gas flows between the probe card and the upper surface of the wafer, and exits through the fluid outlet.

10 Claims, 7 Drawing Sheets

(51) Int. Cl.
   *G01R 1/073* (2006.01)
   *G01R 1/16* (2006.01)

(52) U.S. Cl.
   CPC ........... *G01R 1/16* (2013.01); *G01R 31/2831*
   (2013.01); *G01R 31/2862* (2013.01); *G01R*
   *31/2863* (2013.01); *G01R 31/2868* (2013.01);
   *G01R 31/2891* (2013.01)

(56) References Cited

U.S. PATENT DOCUMENTS

| | | | | |
|---|---|---|---|---|
| 7,126,361 B1* | 10/2006 | Anderson | .......... | G01R 1/07342 |
| | | | | 324/750.08 |
| 2001/0013772 A1* | 8/2001 | Sugiyama | .......... | G01R 31/2891 |
| | | | | 324/762.05 |
| 2003/0218474 A1* | 11/2003 | Sanada | .............. | G01R 31/2863 |
| | | | | 438/18 |
| 2007/0069759 A1 | 3/2007 | Rzepiela et al. | | |
| 2008/0186040 A1* | 8/2008 | Hobbs | ................ | G01R 31/2863 |
| | | | | 324/750.28 |
| 2009/0111276 A1* | 4/2009 | Dhindsa | ............... | G05D 23/192 |
| | | | | 700/121 |

| | | | | |
|---|---|---|---|---|
| 2014/0185649 A1* | 7/2014 | Hirschfeld | ............ | G01R 31/00 |
| | | | | 374/28 |
| 2022/0221508 A1 | 7/2022 | Lou et al. | | |

FOREIGN PATENT DOCUMENTS

| | | |
|---|---|---|
| JP | 2000323536 A | 11/2000 |
| JP | 200222770 A | 1/2002 |
| JP | 200246583 A | 2/2002 |
| JP | 2004198186 A | 7/2004 |
| JP | 2005175094 A | 6/2005 |
| JP | 200693706 A | 4/2006 |
| JP | 4162058 B2 | 10/2008 |
| JP | 2013516770 A | 5/2013 |
| JP | 5599341 B2 | 10/2014 |
| JP | 201535577 A | 2/2015 |
| JP | 2018105725 A | 7/2018 |
| JP | 20217149 A | 1/2021 |
| JP | 202134399 A | 3/2021 |
| KR | 1020120104405 A | 9/2012 |
| KR | 1020120116454 A | 10/2012 |
| KR | 101805446 B1 | 12/2017 |
| KR | 1020200051315 A | 5/2020 |
| KR | 1020220061545 A | 5/2022 |
| WO | WO2013190952 A1 | 12/2013 |

* cited by examiner

METHOD OF HAVING GOOD THERMAL ISOLATION IN WAFER TEST CASSETTE

CROSS-REFERENCE TO RELATED PATENT APPLICATION

This application claims the benefit of priorities to China Patent Application Nos. 202311197186.X, filed on Sep. 15, 2023, and 202311864258.1, filed on Dec. 29, 2023, in the People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a wafer test cassette, and more particularly to a wafer test cassette with thermal conductivity and thermal isolation features.

BACKGROUND OF THE DISCLOSURE

When an integrated circuit is designed for a wafer, the wafer is subjected to a burn-in test and an electrical test. Conventionally, for the burn-in test and a reliability test, each wafer is tested individually using a tester and a probe card. Each wafer is placed on a carrier and electrically contacted by the probes of the probe card to perform the test. Therefore, when the amount of wafers increases, more testers and probe cards are required, causing the test process to be time-consuming and increasing equipment costs.

A wafer test cassette has been developed recently, in which the probe card and the wafer are pre-positioned and configured in the wafer test cassette, and the wafer test cassette is directly and electrically connected to the tester. In addition, the wafer test cassette is disposed in the test unit for the burn-in test or the electrical test. In the burn-in test, the wafer test cassette is in a high-temperature environment whereby the thermal effect may affect the operation of the probe and the tester, causing the efficiency reduction of the test process.

Therefore, how to improve the effectiveness of the wafer test cassette through structural design improvement, to overcome the above issues has become one of the important issues to be addressed in the related field.

SUMMARY OF THE DISCLOSURE

In response to the above-referenced technical inadequacies, the present disclosure provides a wafer test cassette having a thermal isolation effect to prevent a thermal effect caused by the wafer test cassette during a burn-in process from affecting operation of probes and a tester.

In order to solve the above-mentioned problems, one of the technical aspects adopted by the present disclosure is to provide a wafer test cassette having a fluid inlet and a fluid outlet. The wafer test cassette includes a first housing, a second housing, a heat source, and an isolation device. The first housing includes a probe card, and the probe card includes probes. The second housing is coupled to the first housing, and a test space is defined by the second housing and the first housing. The second housing is configured to carry a wafer therein, the wafer is arranged in the test space, and the probes are electrical contact with an upper surface of the wafer to perform a test process. The heat source is configured to heat a lower surface of the wafer, and a high temperature region is defined between the lower surface and the second housing. The isolation device surrounds the high temperature region for thermally isolating the high temperature region from the test space. The fluid inlet is configured to receive a gas, the gas circulates in the test space and is filled between the probe card and the upper surface of the wafer, and the gas is configured to exit through the fluid outlet.

In one of the possible or preferred embodiments, an air pressure in the test space is greater than an air pressure outside the test space.

In one of the possible or preferred embodiments, the wafer test cassette further includes a valve, a sensor, and a control circuit. The sensor and the valve are correspondingly connected to the control circuit, and the valve is configured to open or close the fluid outlet. The sensor is configured to sense at least one of an air pressure or a temperature of the test space and transmit sensing information to the control circuit, and the control circuit controls the opening or closing of the valve according to the sensing information.

In one of the possible or preferred embodiments, the wafer test cassette further includes at least one air extraction device connected to the fluid outlet, and the at least one air extraction device is configured to increase a flow rate of the gas in the test space.

In one of the possible or preferred embodiments, the wafer test cassette further includes an air intake device connected to the fluid inlet, and the air intake device is configured to increase a flow rate of the gas in the test space.

In one of the possible or preferred embodiments, the gas includes air or an inert gas.

In one of the possible or preferred embodiments, a thermal conductivity of the gas is less than 0.026 W/m·k.

In one of the possible or preferred embodiments, a specific heat of the gas is less than 1.015 kJ/(kga·K).

In one of the possible or preferred embodiments, a part of the second housing corresponding to the high temperature region has a heat flow inlet and a heat flow outlet, the heat source is a hot air, and the hot air enters from the heat flow inlet and exits from the heat flow outlet.

Therefore, one of the beneficial effects of the present disclosure is that in the wafer test cassette provided by the present disclosure, by virtue of "the isolation device surrounding the high temperature region for thermally isolating the high temperature region from the test space," and "the fluid inlet being configured to receive the gas, the gas circulating in the test space and flowing between the probe card and the upper surface of the wafer, and the gas being configured to exit through the at least one fluid outlet," the gas is filled between the probe card and the upper surface of the wafer and used to isolate the high temperature region, thereby preventing the probe card from being affected by the high temperature of the wafer when the test process is performed and protecting a test device of the wafer test cassette (e.g., the probe card) as well as a test end (e.g., the tester), thus improving efficiency of the test process using the wafer test cassette.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
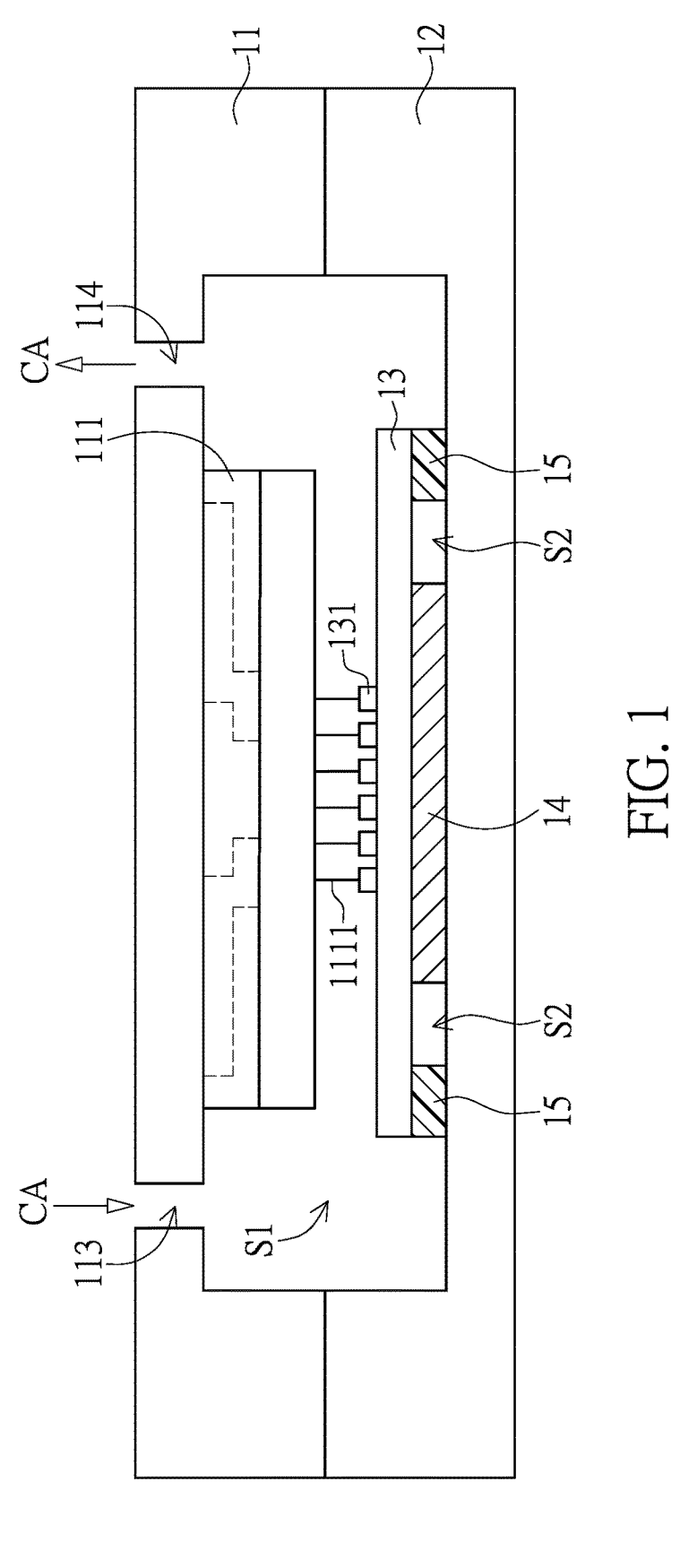
FIG. 1 is a schematic view showing a wafer test cassette in operation according to one embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

EMBODIMENTS

Referring to FIG. 1, FIG. 1 is a schematic view showing a wafer test cassette 1A in operation according to one embodiment of the present disclosure. The wafer test cassette 1A has a fluid inlet 113 and a fluid outlet 114. The wafer test cassette 1A includes a first housing 11, a second housing 12, a heat source 14, and an isolation device 15. The first housing 11 includes a probe card 111, and the probe card 111 includes a plurality of probes 1111. The second housing 12 is coupled to the first housing 11, so that a test space S1 is defined therein. The second housing 12 is configured to carry a wafer 13 in the test space S1, and the plurality of probes 1111 are configured to be correspondingly in electrical contact with an upper surface of the wafer 13, e.g., in electrical contact with pads 131 on the wafer 13, to perform a test process. The heat source 14 is configured to heat a lower surface of the wafer 13, and a high temperature region S2 is defined by the lower surface and the second housing 12. The high temperature region S2 can be a space or a heated "surface". The isolation device 15 surrounds the high temperature region S2 for thermally isolating the high temperature region S2 from the test space S1. In the present embodiment, the isolation device 15 is configured to isolate heat energy generated by the heat source 14 from entering the test space S1, whereby a reduction of heat dissipation efficiency of a gas CA due to transferring of the heat energy can be avoided. The fluid inlet 113 is configured to receive the gas CA, the gas circulates in the test space S1 and is filled between the probe card 111 and the upper surface of the wafer 13, and the gas CA is configured to exit through the fluid outlet 114. A temperature of gas CA can be room temperature or the gas CA can be a cold gas lower than the room temperature.

In certain embodiments, the gas CA can include air or an inert gas. In addition, in certain embodiments, a thermal conductivity of the gas CA is less than 0.026 W/m·k. Further, in certain embodiments, a specific heat of the gas CA is less than 1.015 kJ/(kga·K).

In certain embodiments, the heat source 14 is a heater, but the present disclosure is not limited thereto. Further, in certain embodiments, the heat source 14 can also be hot air or hot gas, which will be described in the following embodiments.

In the present embodiment, the fluid inlet 113 and the fluid outlet 114 are correspondingly arranged in the first housing 11. However, in certain embodiments, one of the fluid inlet 113 and the fluid outlet 114 is arranged in the first housing 11, and another of the fluid inlet 113 and the fluid outlet 114 is arranged in the second housing 12, but the present disclosure is not limited thereto. When the plurality of probes 1111 are configured to perform the test process, the gas CA circulates in the test space S1 and then is discharged, so as to avoid the heat energy caused by the wafer 13 during a burn-in process affecting operations the probe and a tester to which the probe is electrically connected.

Figure 2:
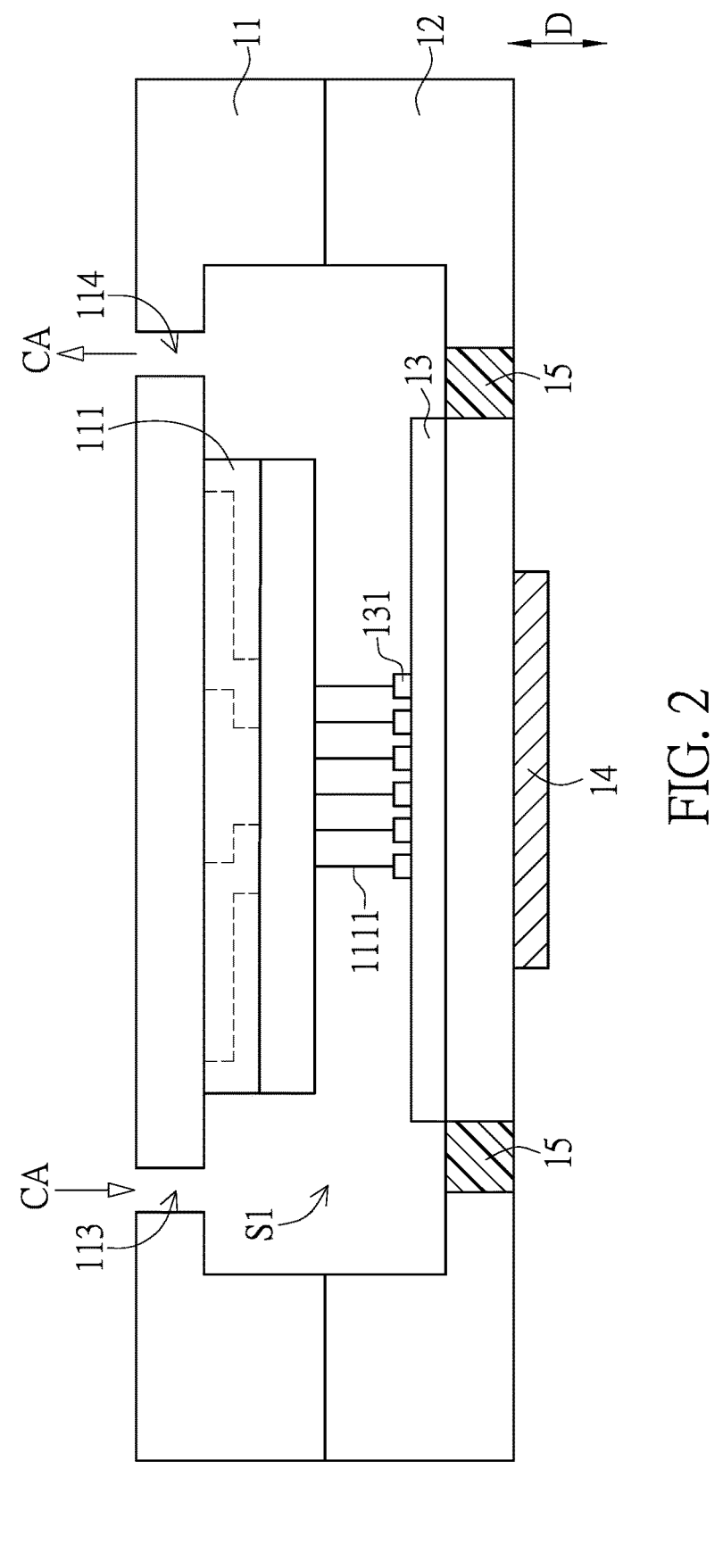
FIG. 2 is another schematic view showing the wafer test cassette in operation according to one embodiment of the present disclosure.

Referring to FIG. 2, FIG. 2 is a schematic view showing a wafer test cassette 1B in operation according to one embodiment of the present disclosure. In the present embodiment, the heat source 14 corresponding to the wafer 13 is provided outside the second housing 12, and the isolation device is disposed in the second housing 12. The isolation device 15 surrounds the wafer 13, and the isolation device 15 is projected along a projection direction D with a projection area covering the heat source 14. In this way, the heat source 14 can heat the wafer 13 through the second housing 12. In addition, the isolation device 15 is configured to block the heat energy from entering the test space S1, or block the heat energy from being transferred to the first housing 11 through the second housing 12, whereby a temperature in the test space S1 is affected.

5

Figure 3:
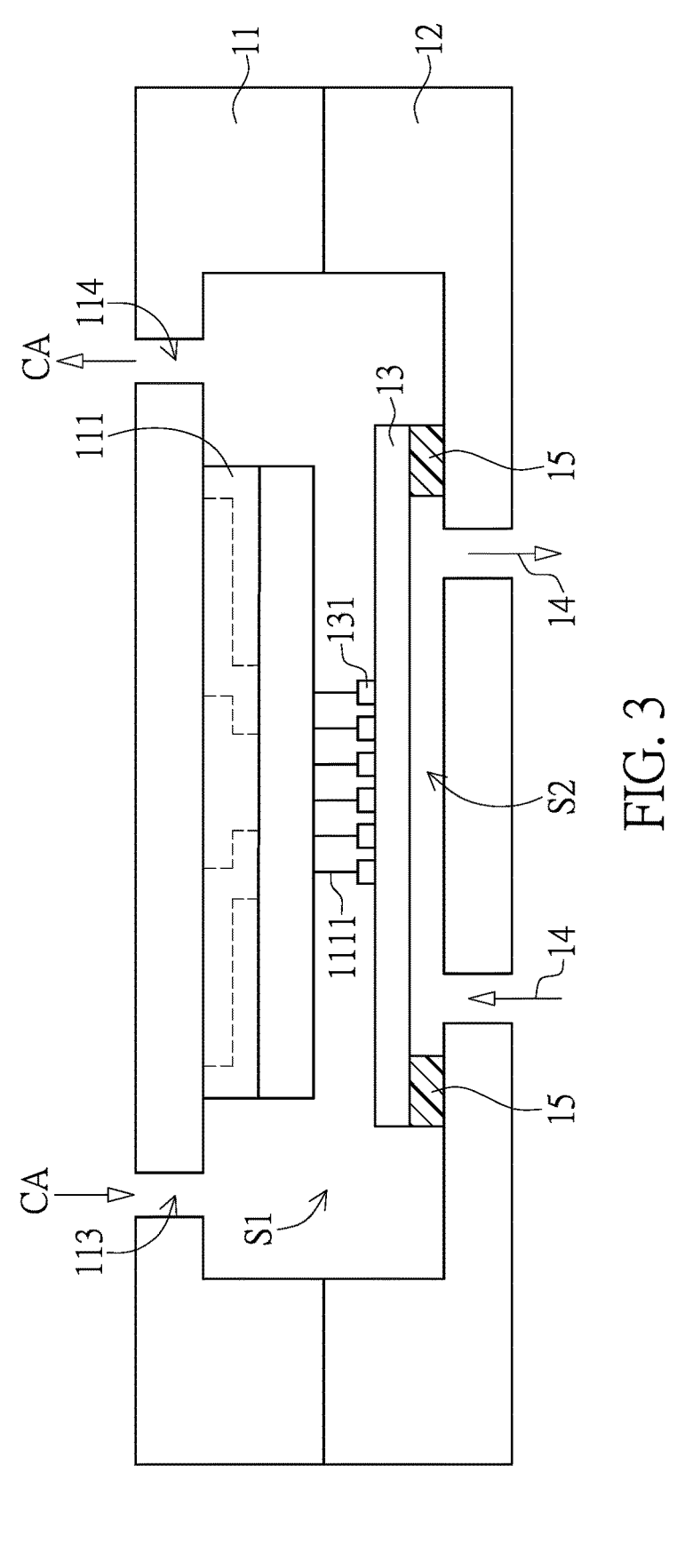
FIG. 3 is further another schematic view showing the wafer test cassette in operation according to one embodiment of the present disclosure.

Referring to FIG. 3, FIG. 3 is a schematic view showing a wafer test cassette 1C in operation according to one embodiment of the present disclosure. In the present embodiment, the heat source 14 is the hot air, a part of the second housing 12 corresponding to the high temperature region S2 has a heat flow inlet and a heat flow outlet, and the hot air enters from the heat flow inlet and exits from the heat flow outlet. In other words, the isolation device 15 is configured to support the wafer 13, and the hot air flows in the high temperature region S2 to heat the wafer 13.

In certain embodiments, when the plurality of probes 1111 are configured to perform the test process, the first housing 11 and the second housing 12 are in a tightly coupled state, and an air pressure in the test space S1 is greater than an air pressure outside the test space S1. In this way, a discharge at a tip of the probe 1111 to the wafer 13 can be suppressed, and damage to the wafer 13 due to a corona discharge can be avoided.

Figure 4:
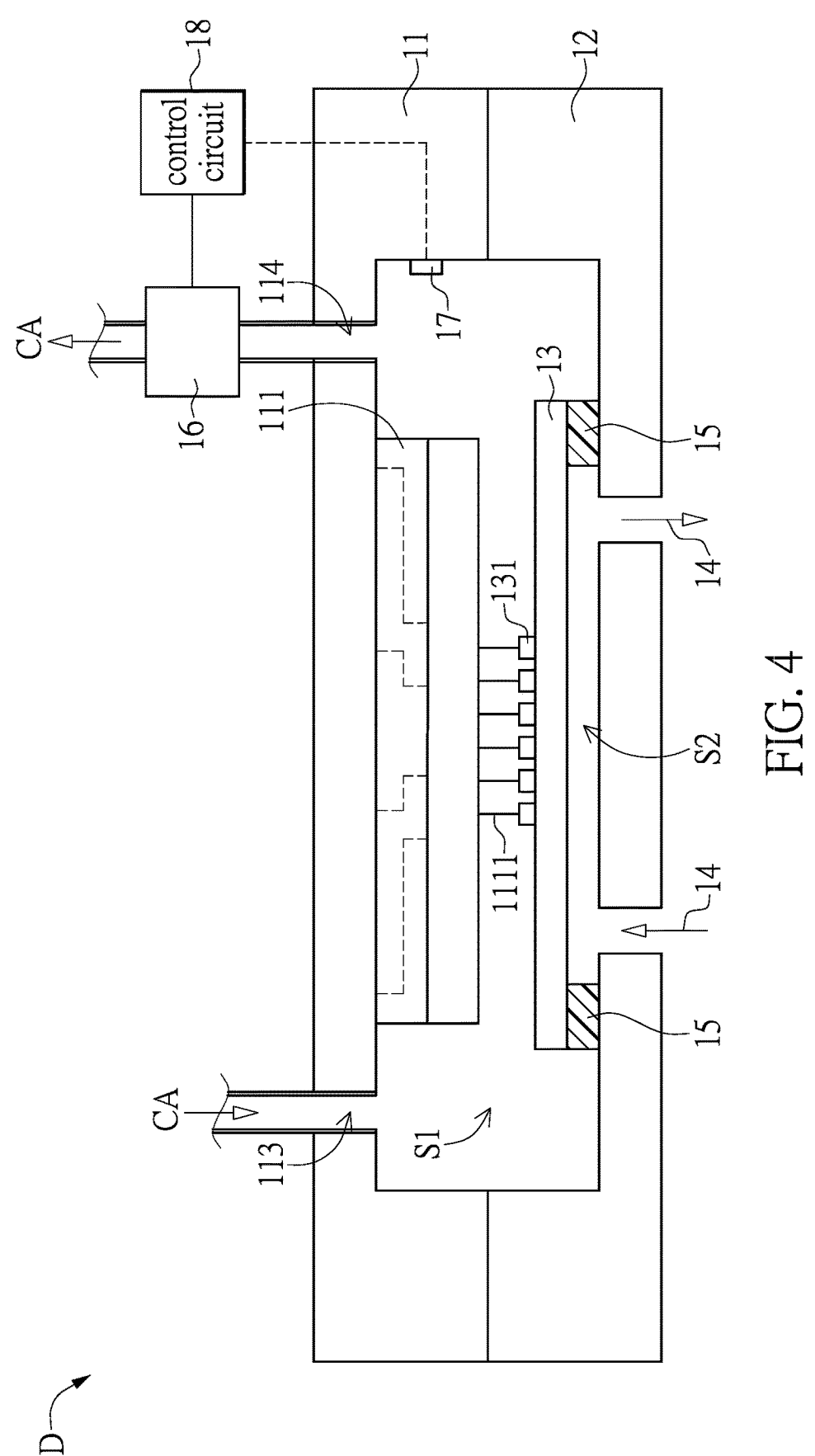
FIG. 4 is yet schematic view showing the wafer test cassette in operation according to one embodiment of the present disclosure.

Referring to FIG. 4, FIG. 4 is a schematic view showing a wafer test cassette 1D in operation according to one embodiment of the present disclosure. The wafer test cassette 1D also includes a valve 16, a sensor 17, and a control circuit 18. The sensor 17 and the valve 16 are correspondingly connected to the control circuit 18, and the valve 16 is configured to open or close the fluid outlet 114. The sensor 17 is configured to sense at least one of the air pressure or the temperature of the test space S1 and transmit sensing information to the control circuit 18, and the control circuit 18 controls the opening or closing of the valve 16 according to the sensing information. That is, the control circuit 18 is configured to receive the sensing information and determine whether or not to discharge the gas CA through the fluid outlet 114 in response to the air pressure and/or the temperature of the test space S1, so as to achieve a purpose of controlling the air pressure and/or the temperature of the test space S1.

Figure 5:
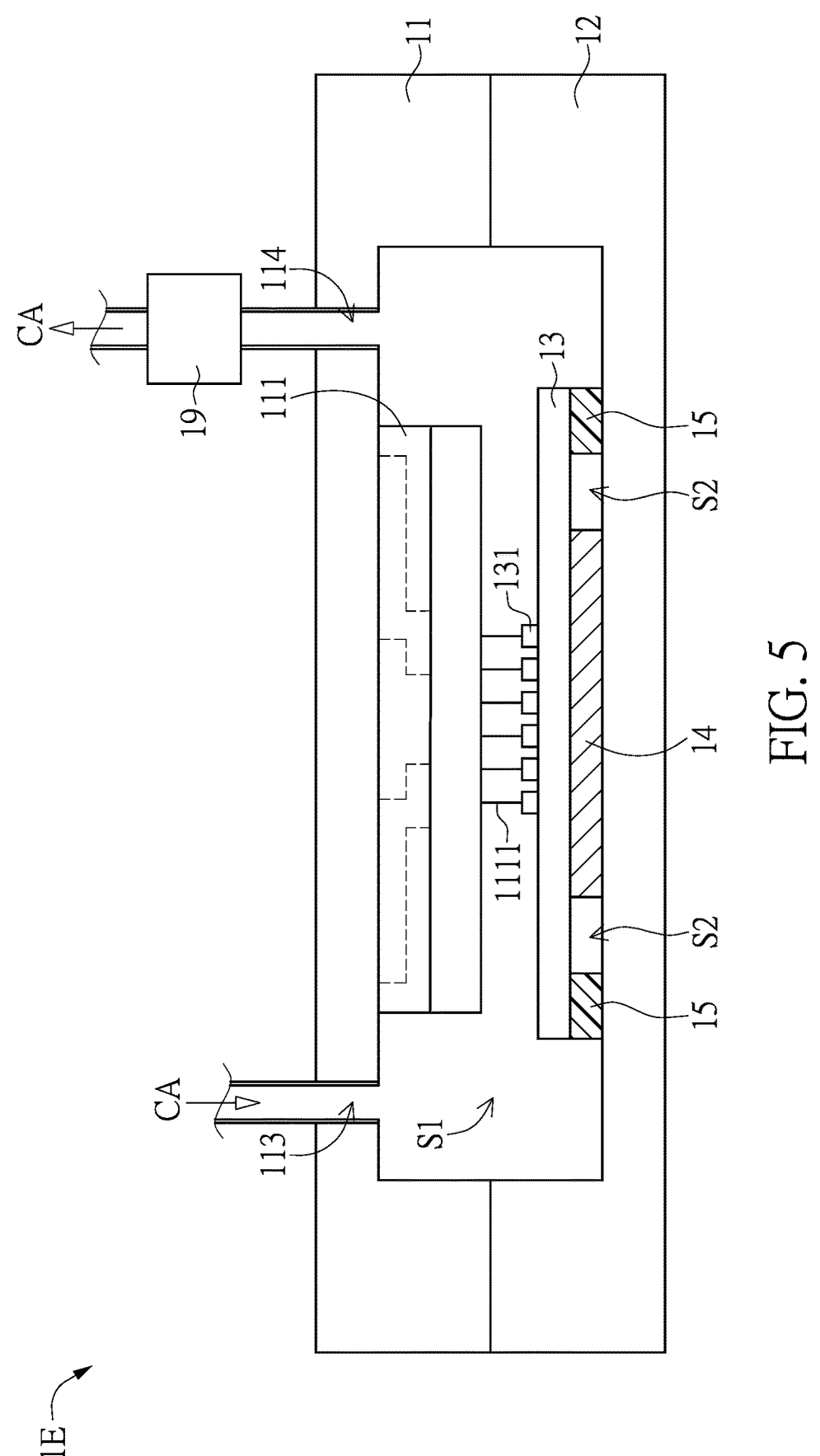
FIG. 5 is still another schematic view showing the wafer test cassette in operation according to one embodiment of the present disclosure.

Referring to FIG. 5, FIG. 5 is a schematic view showing a wafer test cassette 1E in operation according to one embodiment of the present disclosure. In the present embodiment, the wafer test cassette 1E also includes an air extraction device 19 connected to the fluid outlet 114, and the air extraction device 19 is configured to extract the gas CA in the test space S1. In certain embodiments, the air extraction device 19 can sequentially extract the gas CA in the test space S1 or extract different flow rates of the gas CA, according to a degree of the heat energy introduced into the test space S1. In certain embodiments, the air extraction device 19 is connected to the control circuit 18 (as shown in FIG. 4), and the flow rate of the gas CA extracted by the air extraction device 19 is determined by the control circuit 18.

Figure 6:
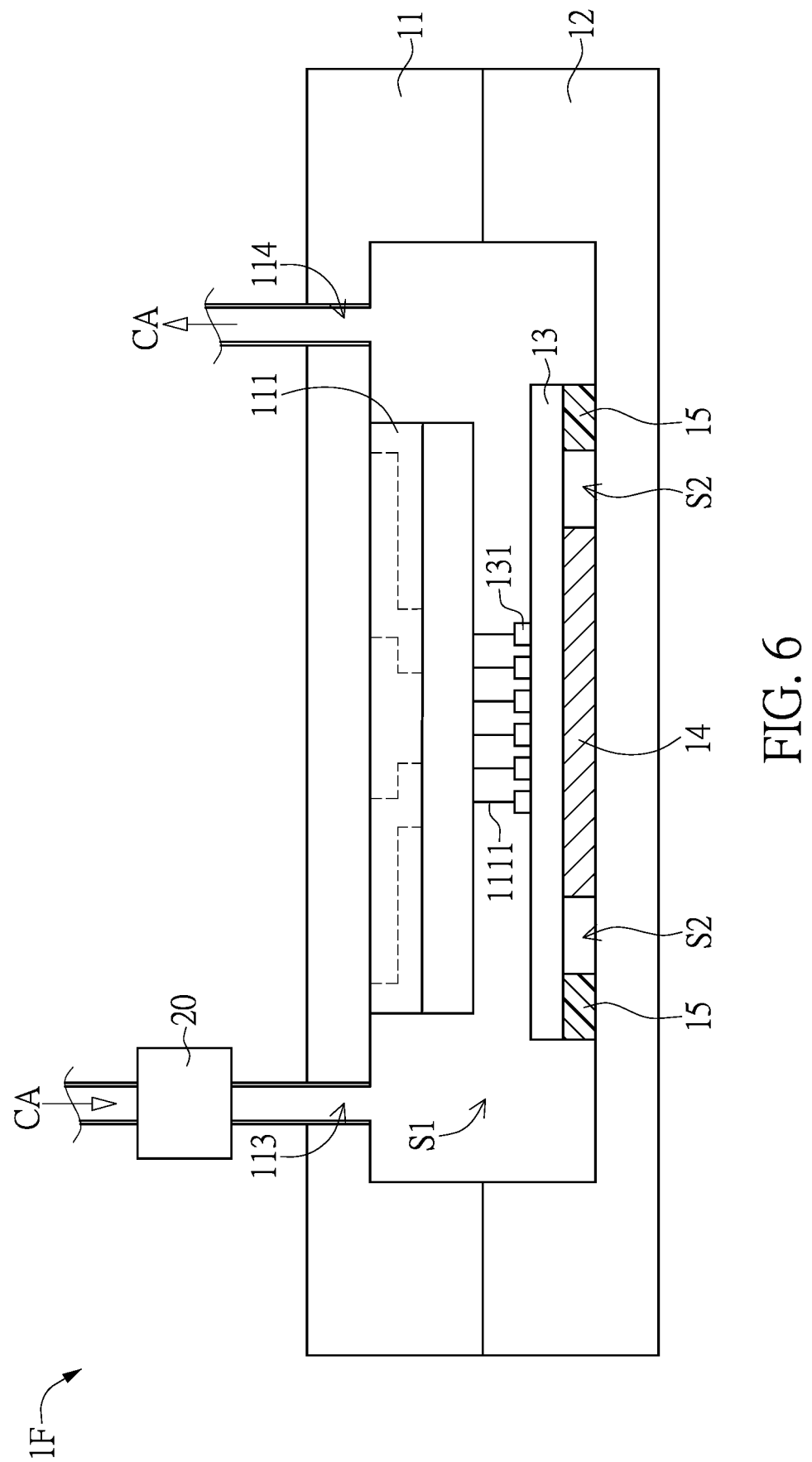
FIG. 6 is still another schematic view showing the wafer test cassette in operation according to one embodiment of the present disclosure.

Referring to FIG. 6, FIG. 6 is a schematic view showing a wafer test cassette 1F in operation according to one embodiment of the present disclosure. In certain embodiments, the wafer test cassette 1F also includes an air intake device 20 connected to the fluid inlet 113, and the air intake device 20 is configured to determine the flow rate of the gas CA feed to the test space S1. In certain embodiments, the air intake device 20 can sequentially feed the gas CA to the test space S1 or feed different flow rates of the gas CA, according to a required flow rate of the gas CA in the test space S1. In certain embodiments, the air intake device 20 is connected to the control circuit 18 (as shown in FIG. 4), and the flow rate of the gas CA feed (or increased) by the air intake device 20 is determined by the control circuit 18.

Figure 7:
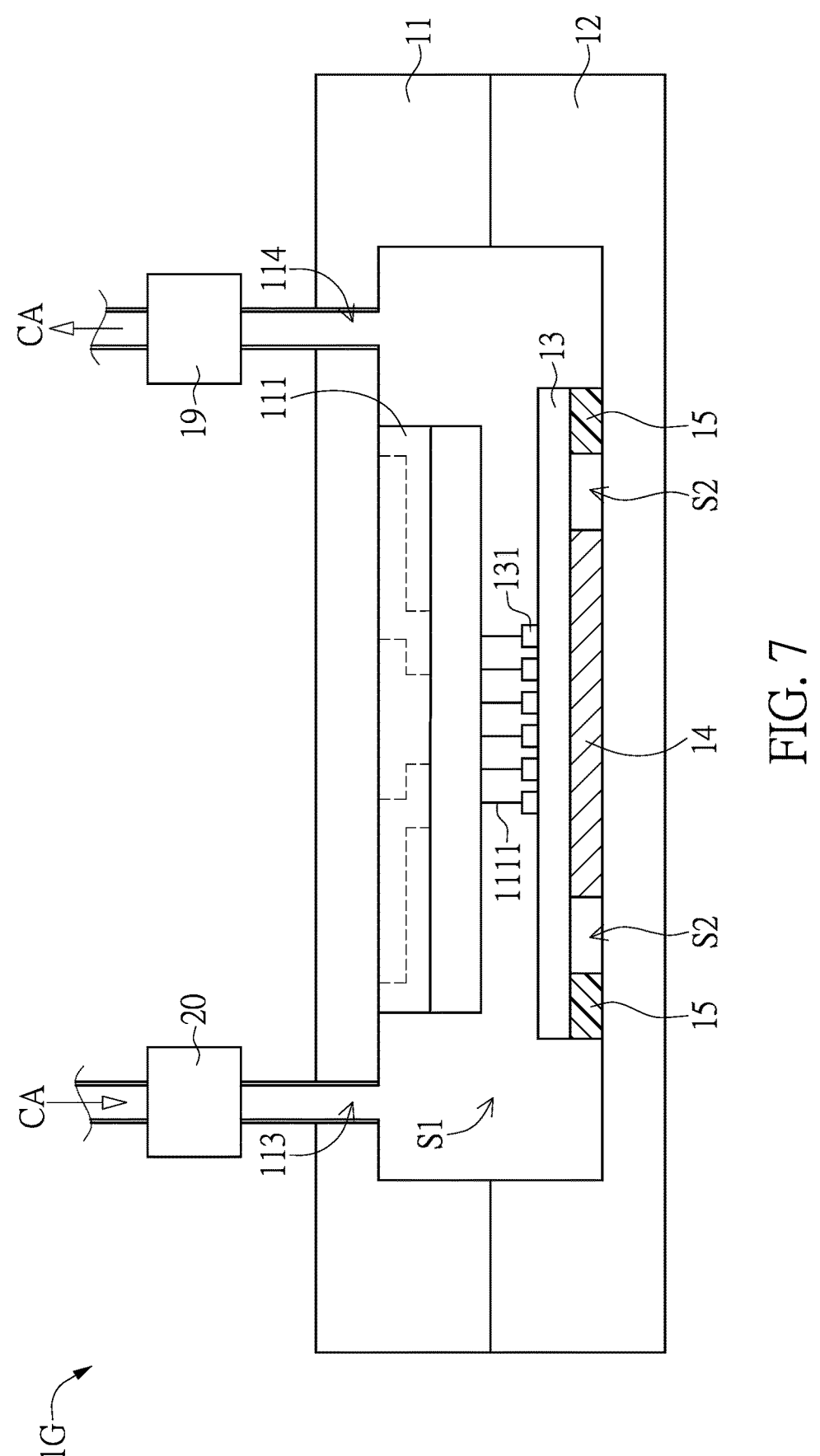
FIG. 7 is still another schematic view showing the wafer test cassette in operation according to one embodiment of the present disclosure.

Referring to FIG. 7, FIG. 7 is a schematic view showing a wafer test cassette 1G in operation according to one embodiment of the present disclosure. In the present embodiment, the wafer test cassette 1G also includes the air extraction device 19 and the air intake device 20. In this way, in the wafer test cassette 1G, the flow rate of the gas CA in the test space S1 can be extracted through the air extraction device 19, the gas CA can be feed to the test space S1 through the air intake device 20, or the flow rate of the gas CA in the test space S1 can be increased through a cooperation of the air extraction device 19 and the air intake device 20.

Beneficial Effects of the Embodiments

In conclusion, one of the beneficial effects of the present disclosure is that in the wafer test cassette provided by the present disclosure, by virtue of "the isolation device surrounding the high temperature region for thermally isolating the high temperature region from the test space," and "the fluid inlet being configured to receive the gas, the gas circulating in the test space and flowing between the probe card and the upper surface of the wafer, and the gas being configured to exit through the at least one fluid outlet," the gas is filled between the probe card and the upper surface of the wafer and used to isolate the high temperature region, thereby preventing the probe card from being affected by the high temperature of the wafer when the test process is performed and protecting a test device of the wafer test cassette (e.g., the probe card) as well as a test end (e.g., the tester), thus improving efficiency of the test process using the wafer test cassette.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wafer test cassette, having at least one fluid inlet and at least one fluid outlet, and the wafer test cassette comprising:

a first housing including a probe card, wherein the probe card includes at least one probe; and a second housing set below and coupled to the first housing, a test space being defined by the second housing and the first housing, wherein the second housing is configured to carry a wafer therein, the wafer is arranged in the test space, and the at least one probe is in electrical contact with an upper surface of the wafer to perform a test process, wherein the second housing includes a heat source and an isolation device, the heat source configured to heat a lower surface of the wafer, and a high temperature region is defined between the lower surface and the second housing, and the isolation device surrounding the high temperature region for thermally isolating the high temperature region from the test space;

wherein the at least one fluid inlet is configured to receive a gas, the gas circulates in the test space and is filled between the probe card and the upper surface of the wafer, and the gas is configured to exit through the at least one fluid outlet.

2. The wafer test cassette according to claim 1, wherein an air pressure in the test space is greater than an air pressure outside the test space.

3. The wafer test cassette according to claim 1, further comprising:

a valve;

a sensor; and a control circuit;

wherein the sensor and the valve are correspondingly connected to the control circuit, and the valve is configured to open or close the at least one fluid outlet; wherein the sensor is configured to sense at least one of an air pressure or a temperature of the test space and transmit sensing information to the control circuit, and the control circuit controls the opening or closing of the valve according to the sensing information.

4. The wafer test cassette according to claim 1, further comprising at least one air extraction device connected to the at least one fluid outlet, wherein the at least one air extraction device is configured to increase a flow rate of the gas in the test space.

5. The wafer test cassette according to claim 1, further comprising an air intake device connected to the at least one fluid inlet, wherein the air intake device is configured to increase a flow rate of the gas in the test space.

6. The wafer test cassette according to claim 1, wherein the gas includes air or an inert gas.

7. The wafer test cassette according to claim 1, wherein a thermal conductivity of the gas is less than 0.026 W/m·k.

8. The wafer test cassette according to claim 1, wherein a specific heat of the gas is less than 1.015 KJ/(kga·K).

9. The wafer test cassette according to claim 1, wherein a part of the second housing corresponding to the high temperature region has a heat flow inlet and a heat flow outlet, the heat source is a hot air, and the hot air enters from the heat flow inlet and exits from the heat flow outlet.

10. The wafer test cassette according to claim 1, wherein the heat source corresponding to the wafer is arranged inside or outside of the second housing and configured to supply heat energy to heat the high temperature region or the wafer.

* * * * *